United States Patent
Nakata

(10) Patent No.: US 8,053,663 B2
(45) Date of Patent: *Nov. 8, 2011

(54) PANEL-SHAPED SEMICONDUCTOR MODULE

(75) Inventor: Josuke Nakata, Kyoto (JP)

(73) Assignees: Kyosemi Corporation, Kyoto (JP); Energy Related Devices, Inc., Los Alamos, NM (US)

( * ) Notice: Subject to any disclaimer, the term of this patent is extended or adjusted under 35 U.S.C. 154(b) by 352 days.

This patent is subject to a terminal disclaimer.

(21) Appl. No.: 12/308,741

(22) PCT Filed: Jul. 7, 2006

(86) PCT No.: PCT/JP2006/313577
§ 371 (c)(1),
(2), (4) Date: Dec. 22, 2008

(87) PCT Pub. No.: WO2008/004304
PCT Pub. Date: Jan. 10, 2008

(65) Prior Publication Data
US 2009/0277497 A1    Nov. 12, 2009

(51) Int. Cl.
*H02N 6/00* (2006.01)
*H01L 31/042* (2006.01)

(52) U.S. Cl. ........ 136/250; 136/251; 136/256; 136/244; 257/726; 257/100; 257/81; 257/99

(58) Field of Classification Search .................. 136/250, 136/251; 257/773, 708, 723, 731
See application file for complete search history.

(56) References Cited

U.S. PATENT DOCUMENTS

| | | |
|---|---|---|
| 4,126,812 A | 11/1978 | Wakefield |
| 4,136,436 A | 1/1979 | Kilby et al. |
| 5,355,873 A | 10/1994 | Del Bon et al. |
| 5,419,782 A | 5/1995 | Levine et al. |
| 5,482,568 A | 1/1996 | Hockaday |
| 5,942,050 A | 8/1999 | Green et al. |
| 6,204,545 B1 | 3/2001 | Nakata |
| 6,252,155 B1 | 6/2001 | Ortabasi |
| 6,355,873 B1 | 3/2002 | Ishikawa |
| 6,440,769 B2 | 8/2002 | Peumans et al. |
| 6,653,551 B2 | 11/2003 | Chen |
| 6,706,959 B2 | 3/2004 | Hamakawa et al. |
| 6,744,073 B1 | 6/2004 | Nakata |
| 7,109,528 B2 | 9/2006 | Nakata |

(Continued)

FOREIGN PATENT DOCUMENTS

| | | | |
|---|---|---|---|
| EP | 1 213 722 | | 6/2002 |
| EP | 2 040 313 | | 3/2009 |
| FR | 2327643 A | * | 6/1977 |
| JP | 7-335925 | | 12/1995 |
| JP | 2001-168369 | | 6/2001 |

(Continued)

*Primary Examiner* — Jennifer K. Michener
*Assistant Examiner* — Marla D McConnell
(74) *Attorney, Agent, or Firm* — Jordan and Hamburg LLP

(57) ABSTRACT

A solar battery module as a panel-shaped semiconductor module comprises multiple spherical or nearly spherical, granular electric power generation semiconductor elements arranged in multiple rows and columns, a conductive connection mechanism electrically connecting in parallel multiple semiconductor elements in each row and connecting in series multiple semiconductor elements in each column, and a conductive inner metal case housing the multiple semiconductor elements and constituting the conductive connection mechanism, wherein each row of semiconductor elements is housed in each reflecting surface-forming groove of the inner metal case, the positive electrodes of the semiconductor electrodes are connected to the bottom plate and the negative electrodes are connected to finger leads, the bottom plate of each reflecting surface-forming grove has a cutoff slit, and the top is covered with a transparent cover member.

13 Claims, 6 Drawing Sheets

| U.S. PATENT DOCUMENTS | | |
|---|---|---|
| 7,205,626 B1 | 4/2007 | Nakata |
| 7,220,997 B2 | 5/2007 | Nakata |
| 7,238,966 B2 | 7/2007 | Nakata |
| 7,238,968 B2 | 7/2007 | Nakata |
| 7,244,998 B2 | 7/2007 | Nakata |
| 2002/0096206 A1 | 7/2002 | Hamakawa et al. |
| 2004/0016456 A1 | 1/2004 | Murozono et al. |
| 2005/0127379 A1 | 6/2005 | Nakata |
| 2006/0162763 A1 | 7/2006 | Hamakawa et al. |
| 2006/0185715 A1* | 8/2006 | Hammerbacher et al. .... 136/250 |
| 2009/0173959 A1* | 7/2009 | Nakata ........................ 257/98 |

| FOREIGN PATENT DOCUMENTS | | |
|---|---|---|
| JP | 2004-093602 | 3/2004 |
| WO | WO-01/99202 | 12/2001 |
| WO | WO-02/35612 | 5/2002 |
| WO | WO-02/35613 | 5/2002 |
| WO | WO-03/017382 | 2/2003 |
| WO | WO-03/017383 | 2/2003 |
| WO | WO-03/036731 | 5/2003 |
| WO | WO-03/056633 | 7/2003 |
| WO | WO-03/094248 | 11/2003 |
| WO | WO-04/011858 | 12/2003 |

* cited by examiner

PANEL-SHAPED SEMICONDUCTOR MODULE

TECHNICAL FIELD

The present invention relates to a panel-shaped light receiving or emitting semiconductor module and particularly to a semiconductor module comprising multiple granular semiconductor elements (semiconductor devices).

BACKGROUND TECHNOLOGY

A variety of solar batteries (solar battery modules and solar battery panels) comprising external lenses for yielding large output power by means of a small light receiving area have been proposed. However, because the larger areas are realized in silicon solar batteries and production cost of solar battery cells and solar battery modules is reduced, light collection by external lenses is less used.

On the other hand, in the solar battery using expensive compound semiconductors such as gallium arsenide (GaAs), light collection by external lenses is assumed to be economical and proposed in many documents.

The U.S. Pat. Nos. 4,136,436 and 6,204,545 by the inventor of the present application propose a spherical or partially spherical solar battery cell made of granular silicon crystal as a technique for efficient use of expensive silicon raw material.

The inventor of the present application proposed in the Japanese Laid-Open Patent Publication No. 2001-168369 a solar battery module having spherical solar battery cells in which a reflecting plate is provided on the back in a close contact manner. The inventor also proposed in the International Publication No. WO03/056633 a spherical solar battery cell housed in a synthetic resin capsule having a diameter larger than the cell and filled with a synthetic resin for light collection. They have a smaller collecting power compared with use of external lenses, however they can be realized in a relatively simple structure.

The U.S. Pat. No. 5,482,568 discloses a micromirror solar battery in which multiple cone-shaped reflecting mirrors are provided in a case, a solar battery cell having a flat light-receiving surface is placed at the bottom of each cone, the sunlight collected by the cone illuminates the top surface of the solar battery cell, and the heat is released from the underside of the cone. The flat solar battery cell receives light only at the top surface and the reflection loss is not small. Therefore, it is difficult to sufficiently increase the incident light usage rate. Furthermore, this micromirror solar battery has the solar battery cells at the bottom of the case so as to prevent the solar battery cells from heating up due to light collection.

The U.S. Pat. No. 5,355,873 discloses a light collection type solar battery module having spherical solar battery cells. A thin metal sheet (common electrode) has multiple nearly semispherical recesses with reflecting inner surfaces. Legs are formed at the centers of the recesses for supporting solar battery cells. A conductive mesh supports multiple solar battery cells at their middle parts. The multiple solar battery cells are set in multiple recesses and electrically connected to the legs. The multiple solar battery cells are connected in parallel by the conductive mesh and sheet. The solar battery cells have no electrode at the top, bottom, or either end and, therefore, the electric current distribution is uneven within a solar battery cell. Hence, it is difficult to improve the electric power generation efficiency. Furthermore, all solar battery cells mounted on the sheet are connected in parallel, which is inconvenient for increasing the output voltage of the solar battery module.

The US Laid-Open Patent Publication No. 2002/0096206 discloses a solar battery module in which spherical solar battery cells are provided in the centers of multiple partially spherical recesses, respectively, the recesses each have a reflecting inner surface, multiple recesses are formed by two thin metal plates and an insulating layer between them, and the two thin metal plates are connected to the positive and negative electrodes of the spherical solar battery cell at the bottom part thereof to parallel-connect multiple solar battery cells.

In the above solar battery module, the spherical solar battery cells are electrically connected to the two thin metal plates at the bottom part. This causes a drawback that the distance between the upper half light receiving surface and the positive and negative electrodes of a spherical solar battery cell is large and the resistance loss upon output electric current retrieval is increased. Furthermore, all solar battery cells of the solar battery module are connected in parallel, which is inconvenient for increasing the output voltage of the solar battery module.

The inventor of the present application disclosed in the International Publication No. WO02/35612 a rod-shaped light receiving or emitting semiconductor element having a pair of electrodes on either end face and a solar battery module using the semiconductor element. However, when this rod-shaped semiconductor element has a higher length/diameter ratio, the resistance between the electrodes is increased. Therefore, the ratio is desirably set for approximately 1.5 or lower.

Patent Document 1: U.S. Pat. No. 4,136,436;
Patent Document 2: U.S. Pat. No. 6,204,545;
Patent Document 3: Japanese Laid-Open Patent Application Publication No. 2001-168369;
Patent Document 4: International Publication No. WO03/056633;
Patent Document 5: U.S. Pat. No. 5,482,568;
Patent Document 6: U.S. Pat. No. 5,355,873;
Patent Document 7: US Laid-Open Patent Publication No. 2002/0096206; and
Patent Document 8: International Publication No. WO02/35612.

DISCLOSURE OF THE INVENTION

Problems to be Solved by the Invention

As in the solar battery modules described in the above publications, when the bottom end of the p-type or n-type base of the granular solar battery cell is connected to a first common electrode and the diffusion layer having a conductivity type different from the base is connected to a second common electrode at the lower or middle part of the solar battery cell, the distance between the upper half light receiving surface and the positive and negative electrodes of a solar battery cell is large and the resistance loss upon output electric current retrieval is increased.

When the solar battery cell has positive and negative electrodes at upper and lower ends and a conductive member connected to the positive electrode and a conductive member connected to the negative electrode are constituted by separate conductive members such as thin metal plates and print wirings, the conductive connection mechanism has a complex structure, which is disadvantageous for production cost.

When spherical solar battery cells are mounted in the centers of partially spherical recesses and light is collected by the reflecting surfaces of the recesses to illuminate the solar battery cells with the sunlight, there are spaces between the recesses, which is disadvantageous in increasing the usage rate of the incident sunlight. Furthermore, the ratio of the light receiving surface of the light collecting recesses to the light receiving surface of the solar battery cells in a plane view cannot be largely increased. Therefore, it is difficult to increase the output power in relation to the light input to the solar battery module surface.

In order to provide lenses circular in a plane view corresponding to the solar battery cells for light collection in a solar battery module having granular solar battery cells, the same number of lenses as the solar battery cells are required. This large number of lenses complicates the structure.

For using a light collection mechanism of the light reflecting type, a cooling mechanism for effectively cooling the solar battery cells is necessary because the solar battery cells significantly heat up. When the reflecting surface is partially spherical, it is difficult to create a smooth passage of the cooling fluid. In such a case, it is not easy to improve the cooling performance.

When multiple solar battery cells in a solar battery module are all connected in parallel, the output voltage of the solar battery module is equal to the output voltage of the solar battery cells. However, it is desirable that the output voltage of the solar battery module is changeable and, in the case of a light emitting panel in which multiple light emitting diodes are installed, the input voltage to the panel is changeable.

The objects of the invention of the present application is to provide a panel-shaped semiconductor module in which the conductive connection mechanism electrically connecting the semiconductor elements has a simplified structure, to provides a panel-shaped semiconductor module having a larger light collecting magnification, to provides a panel semiconductor module advantageous for forming lens parts, and to provide a panel-shaped semiconductor module advantageous for improving the cooling performance.

Means to Solve the Problem

The panel-shaped semiconductor module relating to the present invention is a panel-shaped light receiving or emitting semiconductor module comprising multiple spherical or nearly spherical, granular semiconductor elements having light receiving or emitting capability and arranged in multiple rows and columns with their conducting direction aligned, a conductive connection mechanism electrically connecting in parallel multiple semiconductor elements in each row and electrically connecting in series multiple semiconductor elements in each column, and a conductive inner metal case housing the multiple semiconductor elements and constituting the conductive connection mechanism.

The multiple semiconductor elements each comprises a granular base consisting of a p-type or n-type semiconductor crystal, another conductive layer formed on the surface of the base except for one end portion thereof and having a conductivity type different from the base, a nearly spherical pn junction formed by the base and another conductive layer, and first and second electrodes formed on the surface of the base on either side of a center portion thereof and ohmic-connected to the one end portion of the base and the another conductive layer, respectively.

The inner metal case comprises multiple reflecting surface-forming grooves each housing a row of multiple semiconductor elements and having a width decreasing from an opening to a bottom. The reflecting surface-forming grooves each comprises a light reflecting bottom plate and a pair of light reflecting oblique plates extending upward from either end of the bottom plate in an integrated manner.

The bottom plate has a mount protruding in the center portion in a width direction, on which a corresponding row of multiple semiconductor elements is placed and to which one of the first and second electrodes of the semiconductor elements is electrically connected. Multiple metal finger leads electrically connected to one of the oblique plates of each reflecting surface-forming groove and electrically connected to the other of the first and second electrodes of the corresponding row of multiple semiconductor elements are provided. A cutoff slit for cutting off a conductive part short-circuiting the first and second electrodes of a corresponding row of multiple semiconductor elements is formed in the bottom plate on one side of the mount over the entire length of the row.

Advantages of the Invention

The granular semiconductor element has a base, another conductive layer formed on the surface of the base except for one end portion thereof and having a conductivity type different from that of the base, a pn junction, and first and second electrodes. The first and second electrodes are provided on the surface of the base on either side of the center thereof and ohmic-connected to the one end portion of the base and another conductive layer, respectively. Therefore, the sum of the distances from any point where carriers (electrons and holes) are generated to the first and second electrodes can be reduced throughout the semiconductor element, increasing the electric power generation or light emission output efficiency. Constituted by the inner metal case, the conductive connection mechanism electrically connecting multiple semiconductor elements can have a reduced number of parts and a simplified structure.

The conductive connection mechanism connects in parallel multiple semiconductor elements in each row and connects in series multiple semiconductor elements in each column. When some semiconductor elements fail for some reason, the current flows through an alternative path bypassing the failed semiconductor elements, whereby all normal semiconductor elements continue to work.

The inner metal case comprises multiple reflecting surface-forming grooves having a width decreasing from the opening to the bottom. Each reflecting surface-forming groove comprises a light reflecting bottom plate and a pair of light reflecting oblique plates. A corresponding row of multiple semiconductor elements is placed on a mount provided at the center portion of the bottom plate of the reflecting surface-forming groove. One of the first and second electrodes of the multiple semiconductor elements is electrically connected to the mount.

In this way, in the case of a light receiving semiconductor module, light collected by the reflecting surfaces of the reflecting surface-forming grooves can enter the semiconductor elements. The width of the reflecting surface-forming grooves can be three to four times larger or even much larger than the diameter of the semiconductor elements to increase the ratio of the reflecting surface-forming groove (light collection part) to the light receiving surface of the semiconductor elements, thereby increasing the light collecting magnification. In other words, a smaller number of semiconductor elements can effectively used to obtain high output power.

Furthermore, the semiconductor elements are placed on a mount protruding from the center portion of the bottom plate of the reflecting surface-forming groove. Light reflected by the bottom plate can enter the lower half of the semiconductor element.

Each row of multiple semiconductor elements is housed in each of multiple reflecting surface-forming grooves. Therefore, multiple cylindrical lenses corresponding to multiple reflecting surface-forming grooves, respectively, can advantageously used. The multiple reflecting surface-forming grooves formed by the inner metal case each comprises a bottom plate and a pair of oblique plates. The inner metal case can be constituted by a sheet of metal plate, reducing the number of parts and simplifying the structure.

The present invention can have the following various structures as dependent claims.

(1) The finger leads are each formed by bending a lower end of a score cut part formed on an upper half of an oblique plate nearly at right angle.

(2) The cutoff slits of the inner metal case are each formed by punching out multiple tie bars to form a continuous cutoff slit after one of the first and second electrodes of each row of multiple semiconductor elements is connected to the mount and the other of the first and second electrodes is connected to the finger lead.

(3) An outer metal case fitted on an underside of the inner metal case and having a cross section nearly similar to that of the inner metal case and an electrically insulating synthetic resin layer interposed between the inner and outer metal cases are provided and the inner and outer metal cases are bonded and integrated via the electrically insulating synthetic resin layer.

(4) In the above (3), extensions each extending beyond either end of the inner metal case by a predetermined length in the row direction are provided at either end of the outer metal case in the row direction and side plug blocks made of an insulating material are fitted in and fixed to case housing grooves formed in the extensions.

(5) In the above (4), the reflecting surface-forming grooves of the inner metal case are filled with a transparent flexible insulating synthetic resin material to embed the semiconductor elements and finger leads therein.

(6) In the above (4), a glass or synthetic resin cover member fixed to the inner metal case and side plug blocks for covering a top of the inner metal case is provided.

(7) In the above (6), the cover member has multiple cylindrical lens parts corresponding to multiple rows of semiconductor elements, respectively.

(8) A duct member forming a passage for a cooling fluid is provided on the outer surface of the outer metal case.

(9) An antireflection coating is formed on surfaces of the semiconductor elements except for the areas where the first and second electrodes are provided.

(10) The base of the semiconductor elements is made of a p-type Si monocrystal or Si polycrystal, the other conductive layer is formed by diffusing P, Sb, or As as an n-type impurity, and the semiconductor elements are solar battery cells.

(11) The base of the semiconductor elements is made of an n-type Si monocrystal or Si polycrystal, the other conductive layer is formed by diffusing B, Ga, or Al as a p-type impurity, and the semiconductor elements are solar battery cells.

(12) The semiconductor elements are light emitting diode elements having light emitting capability.

DESCRIPTION OF NUMERALS

Figure 1:
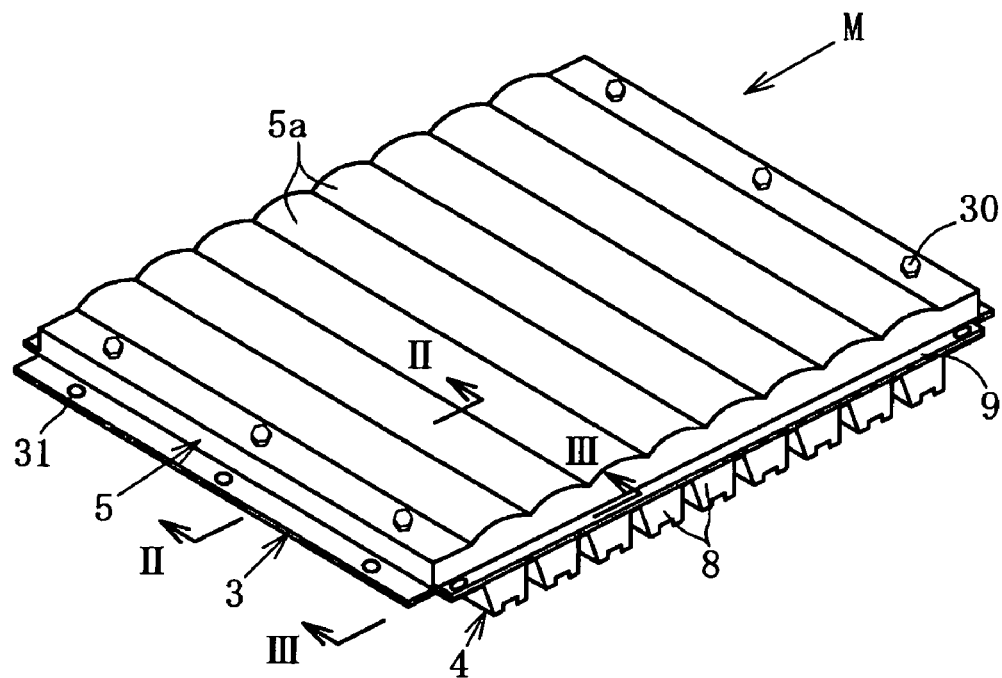
FIG. 1 is a perspective view of a solar battery module relating to Embodiment 1 of the present invention.

M, Ma solar battery module (panel-shaped semiconductor module)
1 semiconductor element
2 conductive connection mechanism
3 inner metal case
4 outer metal case
4A extension
5 cover member
5a cylindrical lens part
6 insulating synthetic resin material
7 synthetic resin layer
8 side plug block
11 base
12 diffusion layer
13 pn junction
14 positive electrode
15 negative electrode
16 antireflection coating
20 reflecting surface-forming groove
21 bottom plate
21a mount
22, 23 oblique plate
25, 25A finger lead
26 cutoff slit
35 duct member
40 light emitting semiconductor element
41 base
42 diffusion layer
43 pn junction
44 positive electrode
45 negative junction
46 antireflection coating

BEST MODE FOR IMPLEMENTING THE INVENTION

The panel-shaped semiconductor module of the present invention has a basic structure comprising multiple granular light receiving or emitting semiconductor elements arranged in multiple rows and columns, a conductive connection mechanism connecting in parallel multiple semiconductor elements in each row and connecting in series multiple semiconductor elements in each column, and an inner metal case housing the multiple semiconductor elements and constituting the conductive connection mechanism, wherein the inner metal case has multiple reflecting surface-forming grooves housing multiple rows of semiconductor elements, respectively, and having a width decreasing from an opening to a bottom.

Embodiment 1

The panel-shaped semiconductor module relating to Embodiment 1 is a solar battery module (solar battery panel) receiving the sunlight and generating electric power. This solar battery module M will be described with reference to the drawings. As illustrated in FIGS. 1 to 5, the solar battery module M comprises multiple granular semiconductor elements 1 having light receiving capability, a conductive connection mechanism 2 electrically connecting the semiconductor elements 1 (see FIG. 9), an inner metal case 3 housing the multiple semiconductor elements 1, an outer metal case 4 fitted on the underside of the inner metal case 3, a transparent cover member 5 covering the top of the inner metal case 3, a silicone rubber insulating synthetic resin material 6 introduced in the inner metal case 3, a synthetic resin layer 7 bonding the inner and outer metal cases 3 and 4 together, multiple side plug blocks 8, and two reinforcement plates 9.

Figure 8:
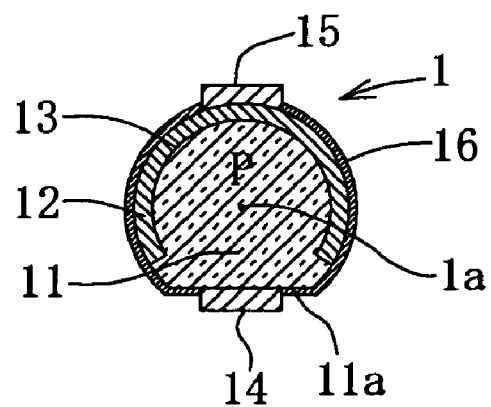
FIG. 8 is an enlarged cross-sectional view of the semiconductor element.

As illustrated in FIG. 8, the semiconductor element 1 is a nearly spherical (a partial sphere close to a sphere), granular solar battery cell having a center 1a. The semiconductor element 1 has a nearly spherical base 11 of p-type silicon monocrystal, an n-type diffusion layer 12 (which corresponds to another conductive layer having a conductivity type different from that of the base 11), a pn junction 13, positive and negative electrodes 14 and 15, and an antireflection coating 16. The semiconductor element 1 receives the sunlight and generates photovoltaic power of approximately 0.5 to 0.6 V.

The base 11 is a p-type silicon monocrystal sphere having a diameter of approximately 1.8 mm with a flat circular section 11a (for example having a diameter of approximately 0.6 to 1.0 mm) at the bottom (one end portion). The diffusion layer 12 is an n-type conductive layer formed by thermal-diffusing P (phosphorus) as an n-type impurity in the surface part of the base 11 to a depth of 0.5 to 1.0 µm except for a part including the flat section 11a and its vicinity.

The p-type base 11 and n-type diffusion layer 12 together form a nearly spherical (a partial sphere closer to a sphere) pn junction 13. The pn junction 13 surrounds most of the periphery of the semiconductor element 1 around the center 1a. A circular positive electrode 14 having a diameter of approximately 0.4 mm is provided on the flat section 11a of the base 11. A circular negative electrode 15 having a diameter of approximately 0.4 mm is provided on the surface of the base 11 at a position across the center 1a from the positive electrode 14. The positive electrode 14 is formed by firing a paste of silver mixed with aluminum. The negative electrode 15 is formed by firing a paste of silver mixed with a small amount of antimony. The positive and negative electrodes 14 and 15 are provided on the surface of the base 11 on either side of the center 1a in parallel to each other. The positive electrode 14 is ohmic-connected to the base 11 and the negative electrode 15 is ohmic-connected to the diffusion layer 12.

An antireflection coating 16 consisting of a silicon oxide coating or silicon nitride coating is formed on the surface of the semiconductor element 1 except for the areas where the positive and negative electrodes 14 and 15 are provided for the purpose of antireflection and silicon surface passivation. When the semiconductor element 1 is illuminated with the sunlight bm and the silicon monocrystal of the base 11 absorbs the sunlight, carriers (electrons and holes) are generated, the pn junction 13 separates the electrons from the holes, and photovoltaic power is generated between the positive and negative electrodes 14 and 15. Even if the incident direction of the incoming sunlight changes, the semiconductor element 1 has uniform light reception sensitivity and efficiently receives the sunlight bm in a wide range of directions and generates electric power (see FIG. 2).

The positive and negative electrodes 14 and 15 are positioned nearly symmetrically about the center 1a of the base 11. For carriers generated in the base 11 upon receiving the sunlight bm, for example, the sum of the distances from any point of the diffusion layer 12 to the positive and negative electrodes 14 and 15 is nearly equal. The photoelectric current distribution is uniform with regard to the center 1a of the base 11 and resistance loss due to uneven distribution can be reduced.

As illustrated in FIGS. 2, 4, 5, and 7, multiple semiconductor elements 1 are arranged in multiple rows and columns in multiple reflecting surface-forming grooves 20 of the inner metal case 3 with their conducting direction aligned. Multiple semiconductor elements 1 are arranged with their positive electrode 14 at the bottom and their negative electrode 15 at the top, whereby they have a vertically downward conducting direction.

The inner metal case 3 is formed by punching a thin plate (for example having a thickness of 0.4 mm) of iron/nickel alloy (Ni 42% and Fe 58%) into a monolithic item in a press machine with a specifically-shaped die. The light receiving inner surface of the inner metal case 3 is mirror finished or either gold or silver plated for improved light reflecting performance.

As illustrated in FIGS. 2, 4, 5, and 7, the inner metal case 3 comprises the same number of gutter-like reflecting surface-forming grooves 20 as the rows of semiconductor elements 1, and flanges 3f and coupling terminals 3a at the right and left ends. The reflecting surface-forming grooves 20 have an inverted trapezoidal cross section having a width linearly decreasing from the opening to the bottom. Each reflecting surface-forming groove 20 comprises a bottom plate 21 and a pair of oblique plates 22 and 23 extending upward from either end of the bottom plate 21. The top ends of the oblique plates 22 and 23 of adjacent reflecting surface-forming grooves 20 are coupled by a narrow coupling plate 24.

Each bottom plate 21 has a mount 21a having a trapezoidal cross section and protruding upward at the center portion in the width direction. Multiple semiconductors 1 of a corresponding row are placed on the mount 21a at proper intervals (for example at intervals of the diameter of the semiconductor elements 1). Their positive electrodes 14 are bonded to the mount 21a using a conductive epoxy resin for electrical connection. Multiple finger leads 25 integrally extend from the middle part of the right oblique plate 23 of each reflecting surface-forming groove 20 to be electrically connected to the negative electrodes of the corresponding row of multiple semiconductor elements 1, respectively. The negative electrodes 15 of the semiconductor elements 1 are bonded to the finger leads 25 using a conductive epoxy resin for electric connection. The finger leads 25 are each formed by bending the lower end of a score cut part formed on the upper half of the right oblique plate 23 at right angle (see FIG. 7).

Figure 2:
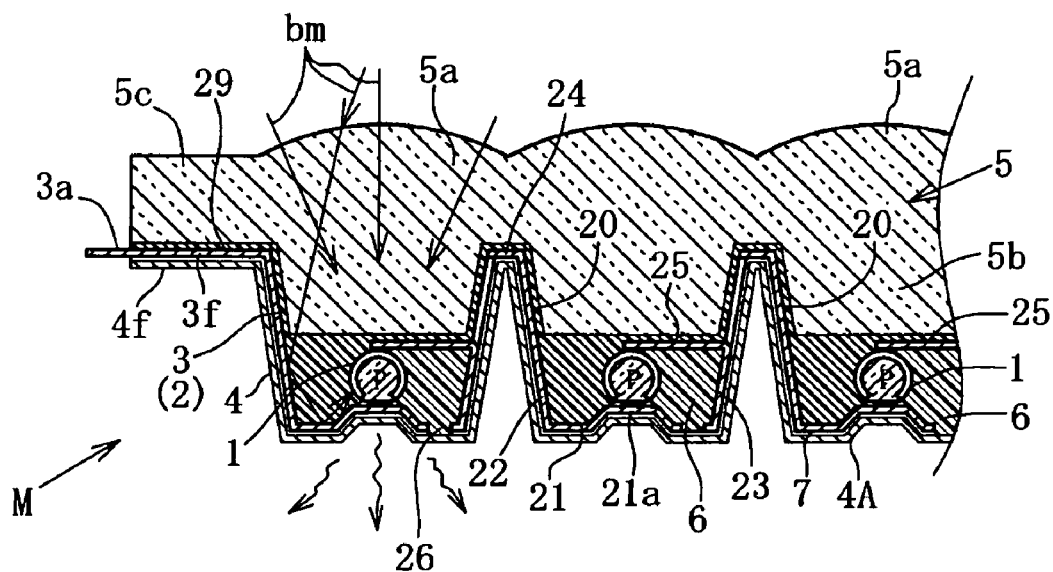
FIG. 2 is a cross-sectional view at the line II-II in FIG. 1.

As illustrated in FIG. 2, a cutoff slit 26 is formed in each bottom plate 21 on the right side of the mount 21a over the entire length in the row direction (the entire length of the inner metal case 3) for cutting off the conduction from the multiple positive electrodes 14 of the corresponding row of multiple semiconductor elements 1 to the multiple finger leads 25 so as to cut off the conductive part short-circuiting between the positive and negative electrodes 14 and 15 of the corresponding row of multiple semiconductor elements 1. Each cutoff slit 26 is formed by punching out the tie bars (not illustrated) of multiple tie bar punch-out portions 26a to form a continuous cutoff slit 26 after the positive electrodes 14 of each row of multiple semiconductors 1 are bonded to the mount 21*a* and the negative electrodes 15 are bonded to the finger leads 25.

As described above, after multiple semiconductor elements 1 are arranged in multiple rows and columns in the inner metal case 3 with their positive electrodes 14 connected to the mount 21*a* and their negative electrodes 15 connected to the finger leads 25 and the cutoff slit 26 is formed in the bottom plate 21 of each reflecting surface-forming groove 20, the semiconductor elements 1 in each row are connected in parallel by the inner metal case 3 and multiple finger leads 25 and multiple semiconductor elements in each column are connected in series by the inner metal case 3 and multiple finger leads 25. In this way, the inner metal case 3 including multiple finger leads 25 constitutes a conductive connection mechanism 2 electrically connecting in parallel multiple semiconductor elements 1 in each row and electrically connecting in series multiple semiconductor elements 1 in each column (see FIG. 9).

As illustrated in FIGS. 2 to 5 and 7, an outer metal case 4 having a cross section nearly similar to the inner metal case 3 is fitted on the underside of the inner metal case 3. The outer metal case 4 is formed by forming the same iron/nickel alloy plate (for example having a thickness of 0.4 mm) as the inner metal case 3. The outer metal case 4 has flanges 4*f* at either end in the column direction. The outer metal case 4 has at either end in the row direction extensions 4A extending beyond either end of the inner metal case 3 in the row direction by a predetermined length. The inner and outer metal cases 3 and 4 are bonded and integrated together via an electrically insulating synthetic resin layer 7 (having a thickness of 0.1 to 0.5 mm) consisting of a heat-resistant insulating adhesive such as polyimide resin introduced between them.

As illustrated in FIGS. 3 and 5 to 7, side plug blocks 8 made of an insulating material (for example a ceramic or glass material) are fitted in case housing grooves 27 formed in the extensions 4A of the outer metal case 4 and bonded thereto using a heat-resistant insulating synthetic resin adhesive such as polyimide resin for completely sealing the ends of the inner metal case 3 in the row direction. The side plug blocks 8 have an oblique inner surface 8*a* tilted similarly to the oblique plates 22 and 23 for improved light reception.

As illustrated in FIG. 2, a flexible transparent silicone rubber insulating synthetic resin material 6 is introduced into the reflecting surface-forming grooves 20 of the inner metal case 3 so as to embed the semiconductor elements 1 and finger leads 25, degassed under reduced pressure, and cured.

Figure 3:
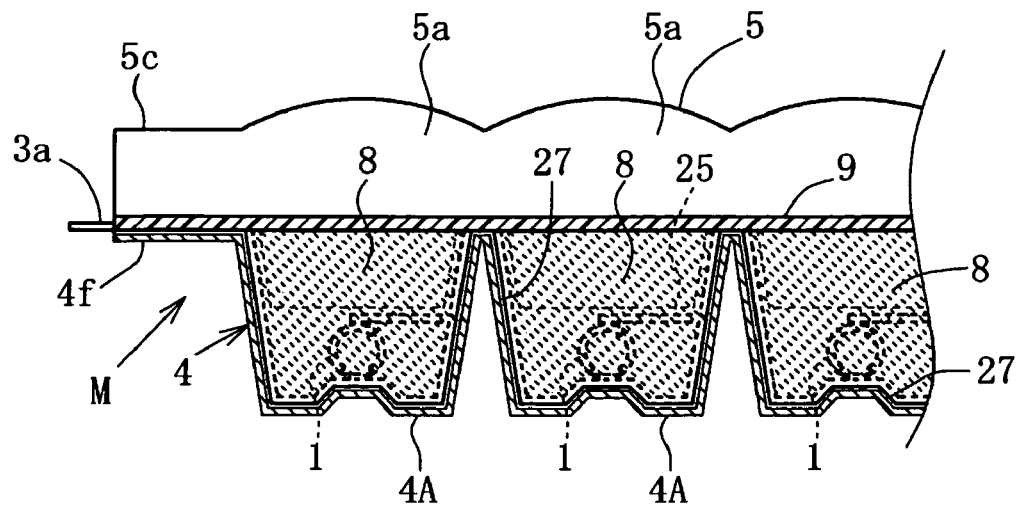
FIG. 3 is a cross-sectional view at the line III-III in FIG. 1.
Figure 4:
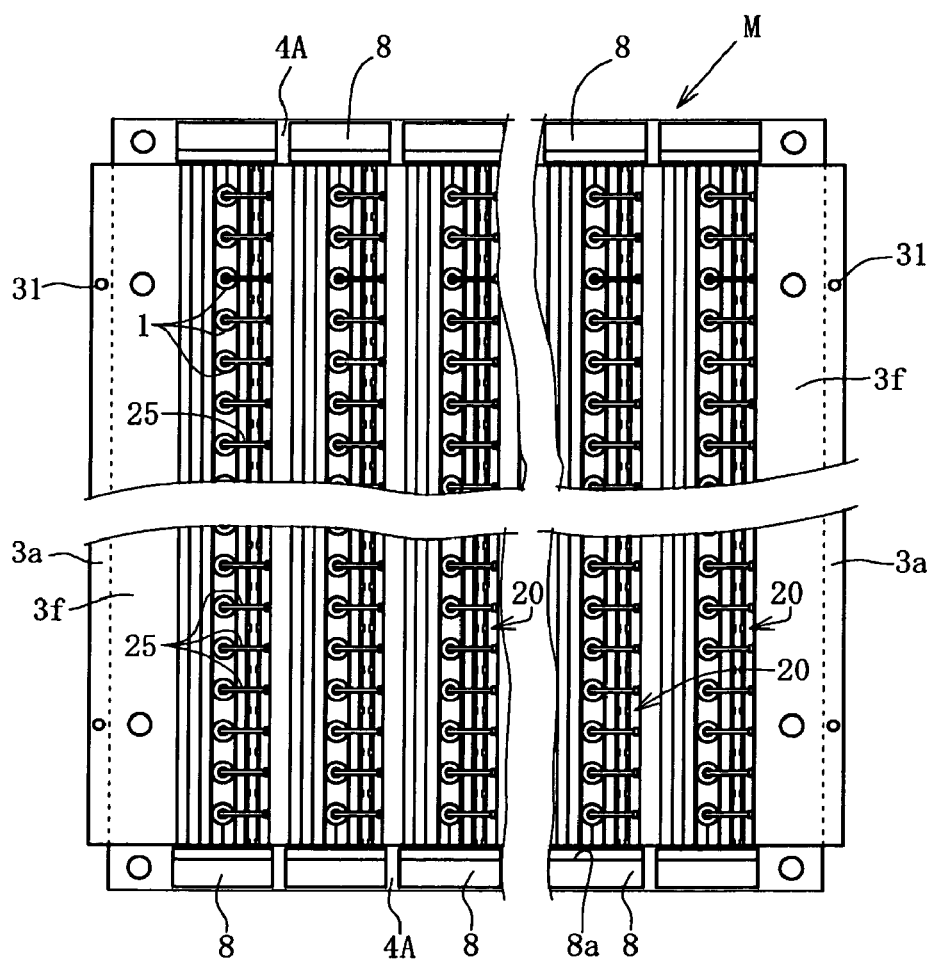
FIG. 4 is a plane view of the solar battery module with a cover member removed.
Figure 5:
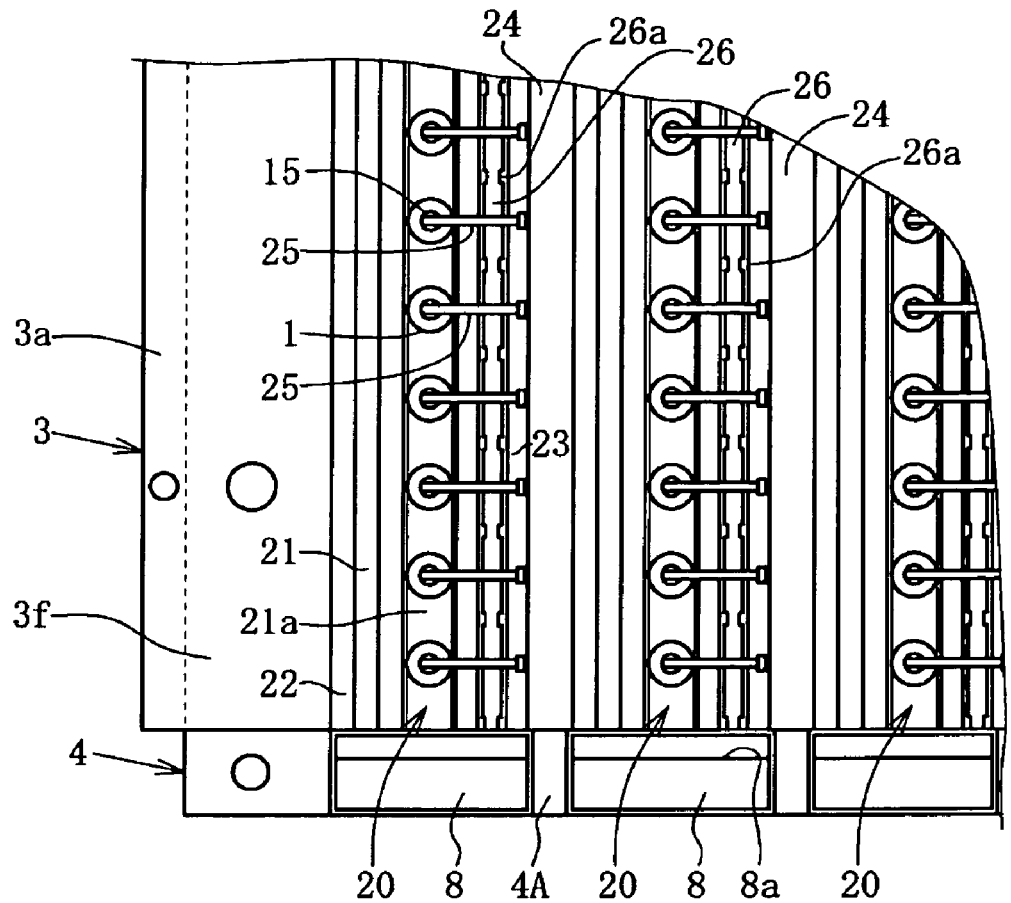
FIG. 5 is an enlarged view of the core part of FIG. 4.
Figure 6:
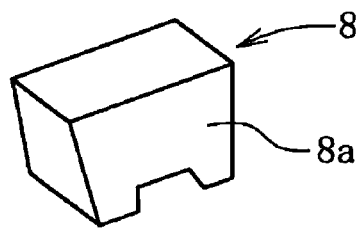
FIG. 6 is a perspective view of the side plug block.
Figure 7:
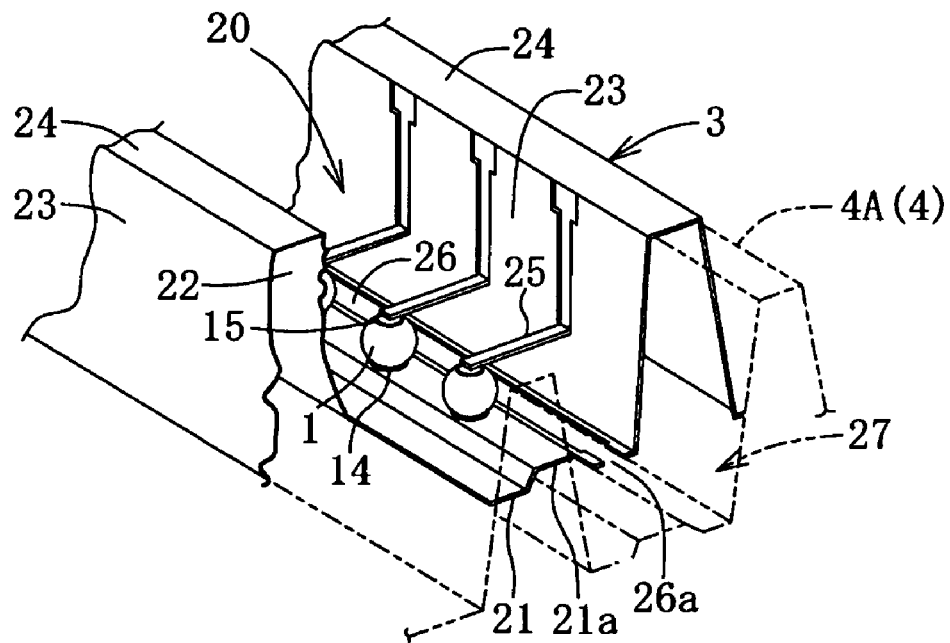
FIG. 7 is a perspective view of the core part of the reflecting surface-forming groove of the inner metal case.

As illustrated in FIGS. 1, 2, and 3, a transparent glass or synthetic resin cover member 5 covering the top of the inner metal case 3 and fixed to the inner metal case 3 and side plug blocks 8 is provided. The cover member 5 is desirably made of white reinforced glass or borosilicate glass. The cover member 5 has multiple cylindrical lens parts 5*a* corresponding to multiple rows of semiconductor elements 1, respectively, at the upper part and engaging parts 5*b* fitted in the upper parts of multiple reflecting surface-forming grooves 20 at the lower part. The cover member 5 has flat parts 5*c* at right and left ends in FIGS. 1 and 2.

In order to fix the cover member 5 to the inner metal case 3, the cover member 5 is attached to the inner metal case 3 with a thick layer of silicone resin applied on the entire underside surface of the cover member 5, whereby the cover member 5 is bonded to the silicone rubber 6 (insulating synthetic resin material) and oblique plates 22 and 23 of multiple reflecting surface-forming grooves 20, to other top surface portions of the inner metal case 3, and to the inner sides of multiple side plug blocks 8. Then, the entire structure is heated under reduced pressure to cure the silicone resin adhesive/sealing material 29. Here, the inner space of each reflecting surface-forming groove 20 is completely filled with the silicone rubber 6 and adhesive/sealing material 29. The right and left flat parts 5*c* of the cover member 5 and flanges 3*f* and 4*f* are fastened together by multiple metal or synthetic resin bolts 30. Here, the bolts 30 are insulated from the flanges 3*f*.

As illustrated in FIGS. 1 and 3, a polyimide resin reinforcement plate 9 closing the top of multiple side plug blocks 8 is provided and fixed using the same adhesive/sealing material as the above described adhesive/sealing material 29 for reinforcing the integrity of the multiple side plug blocks 8 and inner metal case 3.

As illustrated in FIGS. 1 to 5, coupling terminal plates 3*a* are exposed at right and left ends of the inner metal case 3 and extend over the entire length in the row direction for electrically connecting multiple solar battery modules M or coupling the output retrieval lines. Each coupling terminal plate 3*a* has multiple bolt holes 31.

Figure 9:
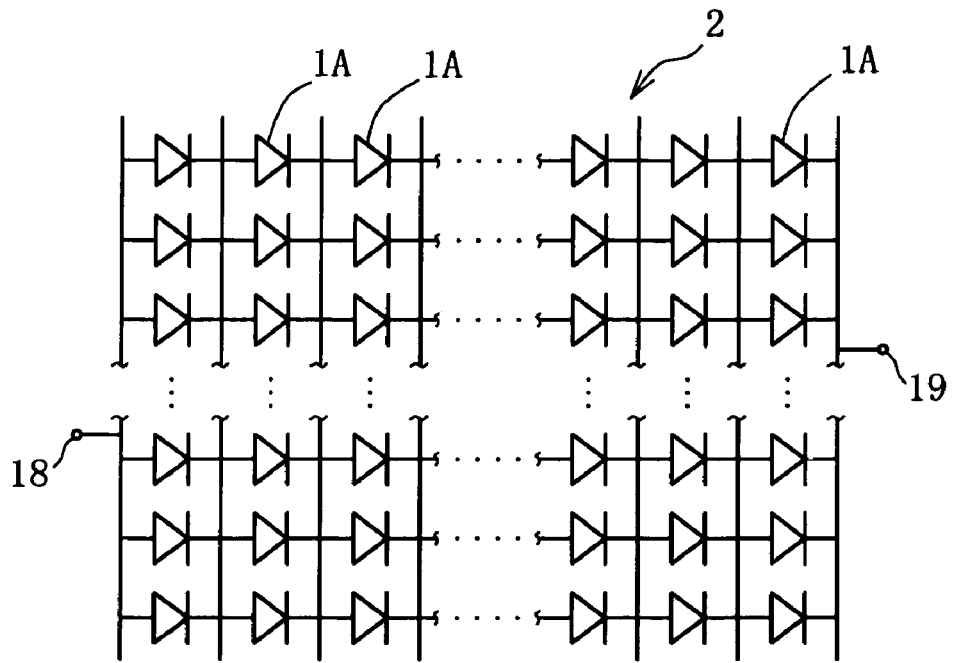
FIG. 9 is a circuit diagram equivalent to the conductive connection mechanism.

FIG. 9 shows an equivalent circuit to multiple semiconductor elements 1 and the conductive connection mechanism 2 of the above described solar battery module M. The semiconductor elements 1 are presented by diodes 1A. In this equivalent circuit, multiple diodes 1A in each row are connected in parallel and multiple diodes 1A in each column are connected in series, whereby all diodes are serial/parallel-connected in a mesh circuit. Photovoltaic power is generated between the positive and negative electrode terminals 18 and 19.

Functions and advantages of the above described solar battery module M will be described hereafter.

The nearly spherical semiconductor elements 1 of this solar battery module M are nearly symmetric about their centers and can receive the sunlight in any direction (directions over approximately 270 degrees), exhibiting sensitivity for a wide angle of light reception. The inner metal case 3 has multiple reflecting surface-forming grooves 20 having a width linearly decreasing from the opening to the bottom. A row of multiple semiconductors 1 is placed at the bottom of each reflecting surface-forming groove 20. The reflecting surface-forming groove 20 has a light reflecting inner surface. Hence, the sunlight falls on the semiconductor elements 1 after multiple reflections on the inner surface of the reflecting surface-forming grove 20.

The width at the opening of the reflecting surface-forming groove 20 can be 3 to 15 times larger than the diameter of the semiconductor elements 1 so that the horizontal area ratio of the reflecting surface-forming groove 20 (light collection part) to the projected light receiving cross section of the semiconductor elements 1 in each row is increased for larger collecting power. Therefore, the necessary number or light receiving area of semiconductor elements 1 can be reduced, which is advantageous for silicon cost and production cost. Furthermore, the semiconductor elements 1 are fixed on the mount 21*a* of the bottom plate 21 of the reflecting surface-forming groove 20. Light reflected by the bottom plate and scattered light can easily enter the semiconductor elements 1; the semiconductor elements 1 have a larger light receiving range. Additionally, the semiconductor elements 1 can easily be positioned and fixed using a conductive epoxy resin.

The transparent flexible silicone rubber 6 is used to embed the semiconductor elements 1 in the reflecting surface-forming groove 20. The semiconductor elements 1 are completely protected from external impact or moisture or air. The silicone rubber 6 absorbs expansion or shrinkage of the solar battery module M due to temperature changes. The refractive index of the silicone rubber 6 is close to that of the cover member 5 and antireflection coating 16, which reduces reflection loss at the interface. Furthermore, the silicone rubber 6 optically couples the semiconductor elements 1, which makes it easier for not only collected direct light but also scattered light resulting from multiple internal reflections to enter the semiconductor elements 1.

In addition, the cover member 5 has cylindrical lens parts 5 each corresponding to a reflecting surface-forming groove 20. The sunlight energy intensity can be approximately 5 to 15 times increased through the light collection by the cylindrical lens parts 5*a*. The output power of the semiconductor elements 1 can be approximately 7 to 15 times increased through the light collection by the cylindrical lens parts 5*a* and light collection by the reflecting surface-forming grooves 20 compared with the case of no light collection by them.

The conductive connection mechanism 2 connects in parallel multiple semiconductor elements 1 in each row and connects in series multiple semiconductor elements 1 in each column. When some semiconductor elements 1 fail for some reason (disconnection, poor connection, in shade, etc.), the current flows through an alternative path bypassing the failed semiconductor elements, whereby all normal semiconductor elements 1 continue to work.

The semiconductor elements 1 have a nearly spherical shape. The positive and negative electrodes 14 and 15 are provided on the surface on either side of the center and ohmic-connected to the base 11 or to the diffusion layer 12. Therefore, the sum of the distances from any point of the diffusion layer 12 to the positive and negative electrodes 14 and 15 is nearly equally and small. The electric resistance between the positive and negative electrodes 14 and 15 can be maintained small. The generated electric power output efficiency can be improved. Furthermore, the conductive connection mechanism is constituted by the inner metal case 3 including multiple finger leads 25, the conductive connection mechanism 2 can have a simplified structure.

The solar battery module M easily heats up and, when heating up, its power generation efficiency is lowered. The inner and outer metal cases 3 and 4 are made of a thin metal plate and integrated together. The inner metal case 3 has multiple gutter-like reflecting surface-forming grooves 20, of which the inner surfaces serve as a reflector/light collector and the back sides serve as a radiator. Particularly, the reflecting surface-forming grooves 20 have a W-shaped cross section with the upwardly bulging mount 21*a* of the bottom plate 21, improving rigidity and strength and increasing the heat dissipation area. Thermal energy absorbed by the solar battery module M is transmitted through the inner metal case 3, polyimide synthetic resin thin layer 7, and outer metal case 4 and released outside.

The reflecting surface-forming grooves 20 of the inner metal case 3 serve both as a container to receive the silicone rubber 6 and as a reception part for engaging with and positioning the engaging part 5*b* of the cover member 5.

The finger leads 25 corresponding to the respective semiconductor elements 1 are integrally formed on one oblique plate 23 of a reflecting surface-forming groove 20. The finger leads 25 are bonded to the negative electrodes 1 of the semiconductors 1 using a conductive epoxy resin. In this way, separate connection leads can be omitted.

The finger leads 25 can be produced as score cut parts formed on the oblique plate 23 while the inner metal case 3 is produced. Upon assembly, the positive electrodes 14 of each row of multiple semiconductors 1 are bonded to the mount 21*a* using a conductive epoxy resin and then the score cut parts are bent to form the finger leads 25, which are then bonded to the negative electrodes 15 of the semiconductor elements 1 using a conductive epoxy resin. After all finger leads 25 are bonded to the negative electrodes 15 of the semiconductor elements 1 in the solar battery module M, the tie bars (not illustrated) connecting multiple tie bar punch-out portions 26*a* are punched out. The finger leads 25 also serve as a marking for positions where the semiconductor elements 1 are placed. The multiple tie bars serve to maintain the integrity of the inner metal case 3 while the inner metal case 3 is formed and allow the inner metal case 3 to be formed from a sheet of metal plate, reducing the number of parts and simplifying the structure.

Partial modifications of the above described embodiment will be described hereafter.

Figure 10:
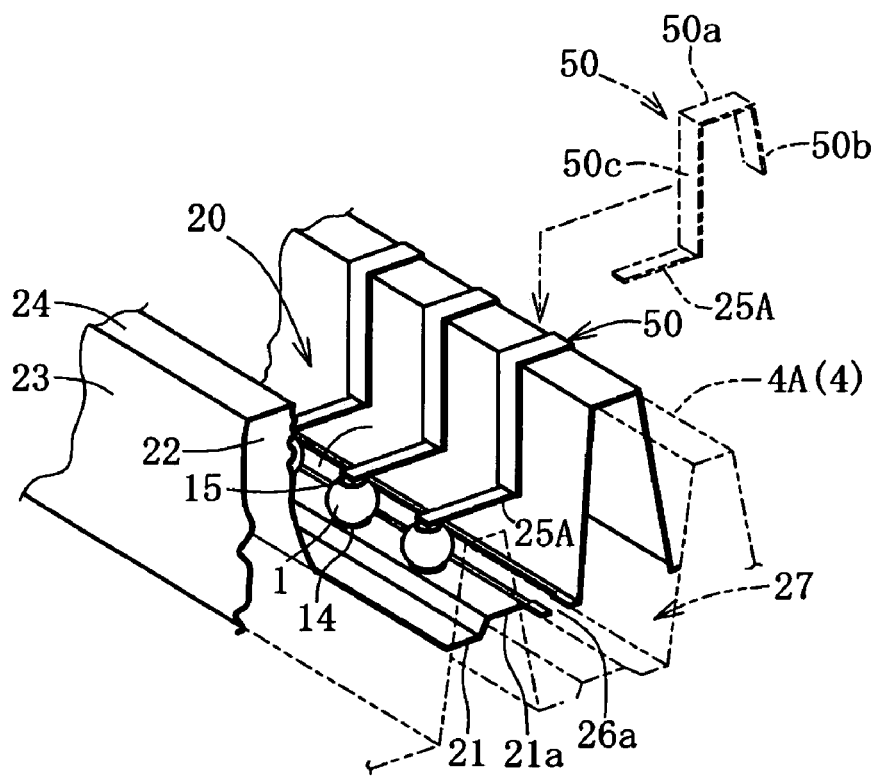
FIG. 10 is a perspective view equivalent to FIG. 7 of a modified embodiment.

1) As illustrated in FIG. 10, in place of the finger leads 25, connection pieces 50 formed separately from the inner metal case 3 by punching out a conductive metal, such as iron and nickel, thin plate are provided at positions corresponding to the semiconductor elements 1 and finger leads 25A horizontally extending to the left are formed at the lower end of the connection pieces 50.

The connection piece 50 is obtained by integral-forming a coupling section 50*a* to be bonded to the coupling part 24 of the inner metal case 3, oblique sections 50*b* and 50*c* provided on either side of the coupling section 50*a* to be bonded to the oblique plates 22 and 23, and the finger lead 25A. For example, the connection piece 50 is bonded to the coupling part 24 and oblique plates 22 and 23 on the either side thereof using a conductive epoxy resin and the leading end of the finger lead 25A is bonded to the negative electrode 15 of the corresponding semiconductor element 1 using a conductive epoxy resin for electric connection. Here, the coupling section 50*a* and oblique sections 50*b* and 50*b* have a width of for example 2 to 3 mm and the finger lead 25A has a width of for example 0.5 to 1 mm.

2) The above described solar battery module M has nine reflecting surface-forming grooves 20. However, several tens of rows and several tens of columns can be provided. The materials of the inner metal case 3, positive and negative electrodes 14 and 15, and outer metal case 4 and various synthetic resin materials are not restricted to the above described embodiment and can be changed by a person of ordinary skill in the field as appropriate.

The diameter of the base 11 of the semiconductor elements 1 is not restricted to the above described embodiment and can be approximately 1.0 to 2.5 mm. The intervals of the semiconductor elements 1 mounted in each reflecting surface-forming groove 20 can be smaller or larger than the intervals in the figure.

3) The base 11 of the semiconductor elements 1 can be a p-type silicon polycrystal and the n-type impurity forming the diffusion layer 12 can be Sb or As. Alternatively, the semiconductor elements 1 can comprise an n-type silicon monocrystal or polycrystal base 11 and a diffusion layer 12 having a p-type impurity such as B, Ga, and Al. The pn junction 13 is not necessarily created by the diffusion layer 12. The pn junction 13 can be created by forming a film on the surface of the base 11 or injecting ions in the surface of the base 11 to form another conductive layer having a conductivity type different from that of the base 11.

4) The flat section Ha of the base 11 of the semiconductor elements 1 can be omitted. The base 11 can be spherical and the positive electrode 14 has the same form as the negative electrode 15. In such a case, the positive and negative electrodes can be different in size or made of metal materials of different colors so that they can be distinguishable from each other.

5) The cross section of the reflecting surface-forming grooves 20 of the inner metal case 3 is not particularly restricted to the above described embodiment. Any groove having a width linearly or nonlinearly decreasing from the opening to the bottom for light collection capability can be used. The inner metal case 3 of a solar module M can be constituted by multiple formed metal plates.

Embodiment 2

Figure 11:
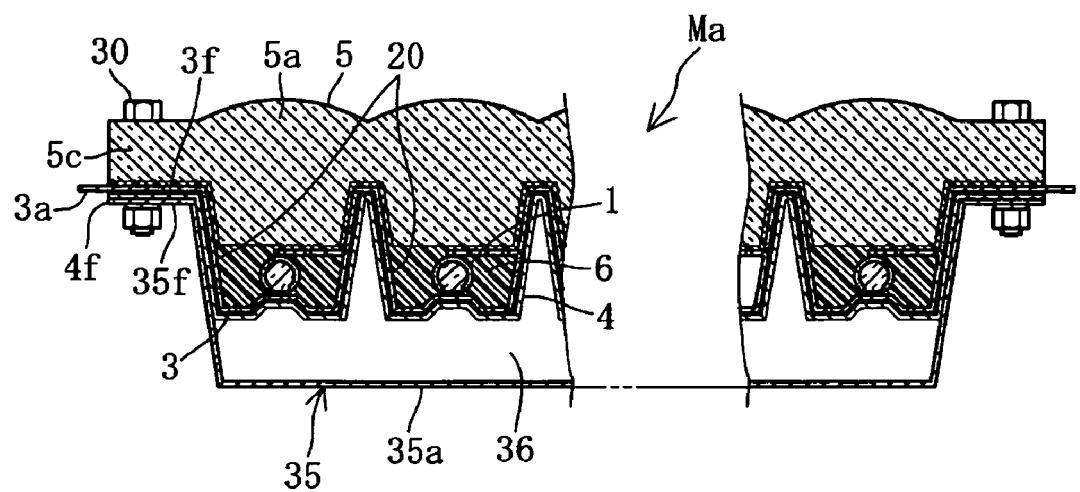
FIG. 11 is a cross-sectional view equivalent to FIG. 2 of a solar battery module relating to Embodiment 2.

A solar battery module Ma (panel-shaped semiconductor module) illustrated in FIG. 11 has a duct member 35 fitted on the underside of the above described solar battery M. The solar battery module Ma has the same structure as the solar battery module M except for the duct member 35. Therefore, the same components are designated by the same reference numerals and their explanation will be omitted. The duct member 35 has an inverted trapezoidal body 35a forming a coolant passage 36 together with the outer metal case 4 for a forced or natural flow of a coolant fluid such as air and cooling water, and flanges 35f extending from right and left ends of the body 35a. The flanges 35f are each fastened to the flat plate 5c of the cover member 5, flange 3f of the inner metal case 3, and flange 4f of the outer metal case 4 by multiple bolts 30 from below.

With a coolant such as air and cooling water running through the coolant passage 36, the inner and outer metal cases 3 and 4 and semiconductor elements 1 can effectively be cooled. Particularly, the inner and outer metal cases 3 and 4 have intricate outer surfaces and accordingly have a large heat transfer area. The semiconductor elements 1 are close to the coolant. Therefore, a high cooling performance can be obtained.

Embodiment 3

This embodiment relates to light emitting semiconductor elements (light emitting diodes) applied to a high output power light emitting diode module with a reflecting mechanism, which is a panel-shaped semiconductor module. This light emitting diode module with a reflecting mechanism comprises light emitting semiconductor elements in place of the semiconductor elements 1 of the above described solar battery module M.

The light emitting semiconductor element will be described hereafter.

Figure 12:
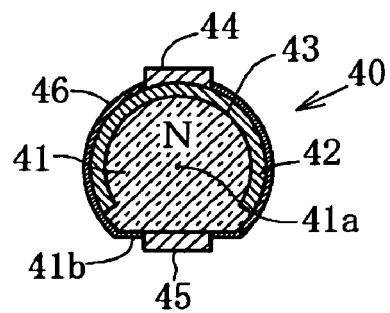
FIG. 12 is an enlarged cross-sectional view of a light emitting semiconductor element relating to Embodiment 3.

As illustrated in FIG. 12, a light emitting semiconductor element 40 has a nearly spherical (a partial sphere close to a sphere) base 41 consisting of an n-type semiconductor crystal, a p-type diffusion layer 42 formed in the surface part of the base 41 (which corresponds to another conductive layer having a conductivity type different from the base), a nearly spherical pn junction 43 formed by the base 41 and diffusion layer 42, positive and negative electrodes 44 and 45, and an antireflection coating 46.

The base 41 consists of an n-type GaAs crystal sphere having a diameter of 1.0 mm with a flat circular section 41b (having a diameter of approximately 0.2 to 0.5 mm) perpendicular to the vertical line passing through the center 41a at the bottom end. The diffusion layer 42 is formed by thermal diffusing a p-type impurity Zn (zinc) in the surface part of the base 41 to a depth of 0.5 to 1.0 μm except for a circular part including the flat section 41b and its vicinity. The positive and negative electrodes 44 and 45 are made of silver-based materials. The negative electrode 45 is provided on the flat section 41b at the center portion and ohmic-connected to the base 41. The positive electrode 44 is provided on the surface of the diffusion layer 42 at a position across the center 41a of the base 41 from the negative electrode 45 and ohmic-connected to the diffusion layer 42.

An antireflection coating 46 consisting of a thin silicon oxide coating or silicon nitride coating and having passivation function is formed on the surface of the base 41 and diffusion layer 42 except for the areas where the positive and negative electrodes 44 and 45 are formed. The light emitting semiconductor element 40 emits infrared light from near the pn junction 43 when a forward current runs from the positive electrode 44 to the negative electrode 45. Because the pn junction 43 has a partial spherical shape close to a sphere, the generated infrared light crosses the surface of the semiconductor element 40 at right angle and exits outside. Therefore, internal reflection loss of the light is reduced and light emission efficiency is improved compared with the prior art light emitting diode having a flat pn junction.

In the high output power light emitting diode module with a reflecting mechanism in which the light emitting semiconductor elements 40 are installed in place of the semiconductor elements 1 of the above described embodiment, when a forward current is supplied from the positive terminal to the negative terminal, the forward current runs through all light emitting semiconductor elements 40, leading to emission of infrared light. The infrared light emitted from the light emitting semiconductor elements 40 exits outside through the cylindrical lens parts 5a of the cover member 5 directly from the reflecting surface-forming groove 20 or after reflected on the reflecting surfaces.

The light emitting semiconductor elements 40 increase their light output as the forward current is increased. However, conversion loss leads to heat generation and to rise in temperature, which reduces light emission efficiency. This light emitting diode module is excellent in heat dissipation as the above described solar battery module M and therefore reduces the rise in the module temperature. Hence, a large light output can be obtained by supplying a large current to a smaller number of light emitting semiconductor elements 40, reducing the light emitting diode module production cost.

The light emitting diode module can be a useful industrial infrared generation apparatus such as a light source of medical equipment, various infrared sensors, and infrared lighting.

Partial modifications of the above described light emitting diode module and light emitting semiconductor element 40 will be described hereafter.

1) The light emitting diode module also can have a duct member as the above described solar battery module Ma.

2) Various light emitting diodes are produced using various semiconductor materials and emit light of various light emission wavelengths according to the characteristics of the semiconductor material. Any light emitting diode produced using such various semiconductor materials can be used. Other than infrared light, light emitting diodes emitting visible or ultraviolet light may also be used.

The base can be constituted by a semiconductor crystal for example selected from GaAlAs, GaP, InGaP, GaN, GaInN, and SiC. SiC is a hexagonal crystal and yields a hexagonal column single-end crystal. Such a hexagonal column single-end crystal can be used to constitute the base.

The pn junction of the light emitting semiconductor element is not necessarily created by a diffusion layer. The pn junction can also be created by forming a film on the surface of the base or injecting ions in the surface of the base to create another conductive layer having a conductivity type different from that of the base. The flat section 41a of the base 41 of the light emitting semiconductor element 40 can be omitted. In such a case, the base 41 is spherical.

INDUSTRIAL APPLICABILITY

The solar battery module is applicable to various fields as a solar power generation apparatus. The light emitting module is applicable to various fields according to the type of light generated.

What is claimed is:

1. A panel-shaped light receiving or emitting semiconductor module characterized by comprising:
    multiple spherical or nearly spherical, granular semiconductor elements each having light receiving or emitting capability and arranged in multiple rows and columns with their conducting direction aligned;
    a conductive connection mechanism electrically connecting in parallel multiple semiconductor elements in each row and electrically connecting in series multiple semiconductor elements in each column; and
    a conductive inner metal case housing said multiple semiconductor elements and constituting said conductive connection mechanism,
    each of said multiple semiconductor elements comprising:
    a granular base consisting of a p-type or-n-type semiconductor crystal;
    another conductive layer formed on the surface of the base except for one end portion thereof and having a conductivity type different from the base;
    a nearly spherical pn junction formed by said base and said another conductive layer; and
    first and second electrodes formed on the surface of said base on either side of a center thereof and ohmic-connected to said one end portion of said base and said another conductive layer, respectively;
    said inner metal case comprising multiple reflecting surface-forming grooves each housing a row of multiple semiconductor elements and having a width decreasing from an opening to a bottom;
    said reflecting surface-forming grooves each comprising a light reflecting bottom plate and a pair of light reflecting oblique plates extending upward from either end of the bottom plate in an integrated manner;
    said bottom plates each having a mount protruding in a center portion in a width direction, on which a corresponding row of multiple semiconductor elements is placed and to which one of the first and second electrodes of the semiconductor elements is electrically connected; and
    multiple metal finger leads electrically connected to one of the oblique plates of each reflecting surface-forming groove and electrically connected to the other of the first and second electrodes of the corresponding row of multiple semiconductor elements being provided, and a cutoff slit for cutting off a conductive part short-circuiting the first and second electrodes of a corresponding row of multiple semiconductor elements being formed in said bottom plate on one side of said mount over an entire length of the row.

2. The panel-shaped semiconductor module according to claim 1; wherein said finger leads are each formed by bending a lower end of a score cut part formed on an upper half of the oblique plate nearly at right angle.

3. The panel-shaped semiconductor module according to claim 2; wherein the cutoff slits of said inner metal case are each formed by punching out multiple tie bars to form a continuous cutoff slit after one of the first and second electrodes of each row of multiple semiconductor elements is connected to said mount and the other of the first and second electrodes is connected to the finger lead.

4. The panel-shaped semiconductor module according to any of claims 1 to 3; wherein an outer metal case fitted on an underside of said inner metal case and having a cross section nearly similar to that of said inner metal case and an electrically insulating synthetic resin layer interposed between said inner and outer metal cases are provided and the inner and outer metal cases are bonded and integrated via the electrically insulating synthetic resin layer.

5. The panel-shaped semiconductor module according to claim 4; wherein extensions each extending beyond either end of the inner metal case in the row direction by a predetermined length are provided at either end of said outer metal case in the row direction and side plug blocks made of an insulating material are fitted in and fixed to case housing grooves formed in the extensions.

6. The panel-shaped semiconductor module according to claim 5; wherein the reflecting surface-forming grooves of said inner metal case are filled with a transparent flexible insulating synthetic resin material to embed said semiconductor elements and finger leads therein.

7. The panel-shaped semiconductor module according to claim 5; wherein a glass or synthetic resin cover member fixed to said inner metal case and side plug blocks for covering a top of said inner metal case is provided.

8. The panel-shaped semiconductor module according to claim 7; wherein said cover member has multiple cylindrical lens parts corresponding to multiple rows of semiconductor elements, respectively.

9. The panel-shaped semiconductor module according to any of claims 1 to 3; wherein a duct member forming a passage for a cooling fluid is provided on the outer surface of said outer metal case.

10. The panel-shaped semiconductor module according to any of claims 1 to 3; wherein an antireflection coating is formed on surfaces of said semiconductor elements except for areas where the first and second electrodes are provided.

11. The panel-shaped semiconductor module according to any of claims 1 to 3; wherein the base of said semiconductor elements is made of a p-type Si monocrystal or Si polycrystal, said other conductive layer is formed by diffusing P, Sb, or As as an n-type impurity, and said semiconductor elements are solar battery cells.

12. The panel-shaped semiconductor module according to any of claims 1 to 3; wherein that the base of said semiconductor elements is made of an n-type Si monocrystal or Si polycrystal, said other conductive layer is formed by diffusing B, Ga, or Al as a p-type impurity, and said semiconductor elements are solar battery cells.

13. The panel-shaped semiconductor module according to any of claims 1 to 3; wherein said semiconductor elements are light emitting diode elements having light emitting capability.

* * * * *